/ Patent Number: 6,013,539
Date of Patent: Jan. 11, 2000

United States Patent
Kashima et al.

[54] EDGE EMITTING LED AND METHOD OF FORMING THE SAME

[75] Inventors: Yasumasa Kashima; Tsutomu Munakata, both of Tokyo, Japan

[73] Assignee: Oki Electric Industry Co., Ltd., Tokyo, Japan

[21] Appl. No.: 09/003,694

[22] Filed: Jan. 7, 1998

Related U.S. Application Data

[62] Division of application No. 08/805,716, Feb. 25, 1997, Pat. No. 5,757,027.

[30] Foreign Application Priority Data

Feb. 27, 1996 [JP] Japan ..................................... 8-039348

[51] Int. Cl.[7] .................................................. H01L 21/20
[52] U.S. Cl. .................................. 438/31; 438/29; 438/37
[58] Field of Search ................................... 438/23, 24, 29, 438/31, 32, 37, 46, 47; 257/79, 81, 94; 385/8, 9, 130, 131

[56] References Cited

U.S. PATENT DOCUMENTS 5,574,289  11/1996  Aoki et al. .

FOREIGN PATENT DOCUMENTS 0 680 119   11/1995   European Pat. Off. .
02 077 174   3/1990   Japan .
06 069 538   3/1994   Japan .

OTHER PUBLICATIONS

Osowsi et al., "Broadband emission from InGaAs--GaAs–AlGaAs LED with integrated absorber by selective area MOCVD", Electronics Letters 31 (17) pp. 1498–1499, Aug. 1995.

Primary Examiner—Charles Bowers
Assistant Examiner—K. Christanson
Attorney, Agent, or Firm—Rabin & Champagne, P.C.

[57] ABSTRACT

An edge emitting LED comprises a semiconductor substrate having a main surface, an active layer formed over the main surface, and the active layer having a light emitting region, an optical absorption region having a bandgap energy smaller than that of the light emitting region, and a composition change region formed between the light emitting region and the optical absorption region, the composition change region having the bandgap energy continuously changes. Accordingly, an edge emitting LED is able to produce a stable, spontaneous emission of a light under a wide range of operating conditions. Furthermore, a method of forming an edge emitting LED, comprising the steps of: providing a semiconductor substrate having a previous formation region of an active layer having a light emitting region and an optical absorption region continued with the light emitting region; forming a mask pattern over the substrate located on both sides of the optical absorption region; and forming the active layer over the formed structure. Accordingly, a method of forming a edge emitting LED is able to form a light emitting region and an optical absorption region, with one-step growth.

13 Claims, 7 Drawing Sheets

EDGE EMITTING LED AND METHOD OF FORMING THE SAME

This is a Division of application Ser. No. 08/805,716, filed Feb. 25, 1997 now U.S. Pat. No. 5,757,027.

CROSS REFERENCE TO RELATED APPLICATION

This application claims the benefit of priority of application Ser. No. 039348/1996, filed Feb. 27, 1996 in Japan, the subject matter of which is incorporated herein by reference.

BACKGROUND OF THE INVENTION

1. Field of the Invention

The present invention relates to an edge emitting LED (light emitting diode) and a fabrication method, paticuraly to an edge emitting LED having a selective-area growth optical absorption region.

2. Description of the Related Art

Figure 6:
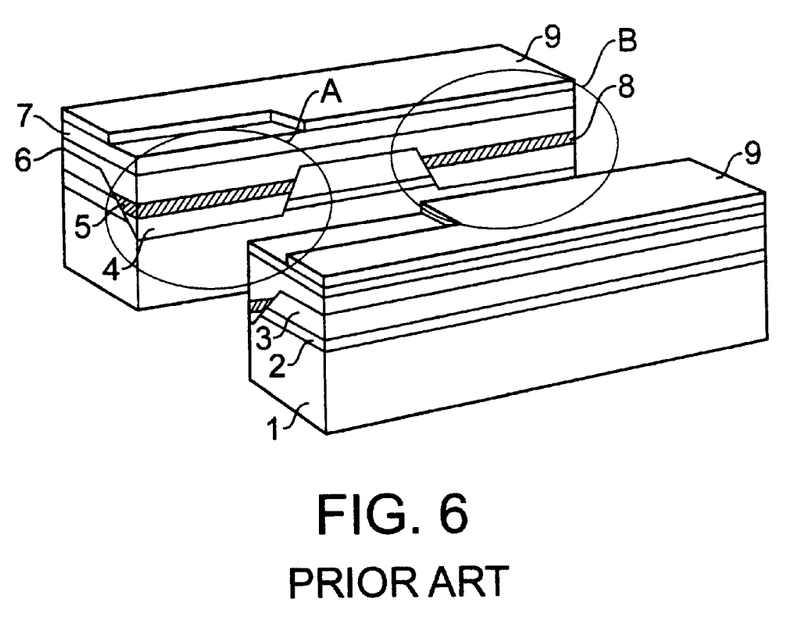
FIG. 6 is perspective cross sectional view showing an edge emitting LED in accordance with the prior art.

FIG. 6 is perspective cross sectional view showing a light emitting diode in accordance with the prior art.

Referring to FIG. 6, a prior art edge-emitting LED comprises a p-InP substrate 1, an n-InP block layer 2, a p-InP block layer 3, a p-InP cladding layer 4, active layers 5, 8, a p-InGaAsP light emitting region A, an n-InGaAsP contact layer 7, a p-InGaAsP optical absorption region B, and an SiO2 film 9.

The prior art edge emitting LED has an optical absorption region B separated from the light emitting region A and the InP block layer 6.

A backward light emitted in the light emitting region A is propagated to the InP block layer 6 with some radiation angles due to diffraction, through the optical absorption region B.

Then, the backward light combines with the optical absorption region B. Since an effective bandgap of the optical absorption region B is smaller than that of the light emitting region A, the light combined with the optical absorption region B decreases due to an optical absorption effect.

As a result, very small light core reach to the back facets of the optical absorption region B and the optical feedback to the light emitting region A can be avoided.

SUMMARY OF THE INVENTION

It is an object of the present invention to provide an edge emitting LED that is able to produce a stable, spontaneous emission of light under a wide range of operating conditions.

According to one aspect of the present invention, for achieving the above object, there is provided an edge emitting LED, comprising:

a semiconductor substrate having a main surface;

an active layer formed over the main surface; and the active layer having a light emitting region, an optical absorption region having a bandgap energy smaller than that of the light emitting region, and a composition change region formed between the light emitting region and the optical absorption region, the composition change region having the bandgap energy continuously changes.

According to another aspect of the present invention, for achieving the above object, there is provided an edge emitting LED, comprising:

a semiconductor substrate having a main surface;

an active layer formed over the main surface; and the active layer having a light emitting region, an optical absorption region having a thickness thicker than that of the light emitting region, and a composition change region formed between the light emitting region and the optical absorption region, the composition change region being of continually changing thickness.

The present invention is also directed to a method of forming a light emitting diode.

It is an object of the present invention to provide a method of forming an edge emitting LED that is able to form a light emitting layer and an optical absorption layer with one-step growth.

According to one aspect of the present invention, for achieving the above object, there is provided a method of forming an edge emitting LED, comprising the steps of:

providing a semiconductor substrate having a previous formation region of an active layer having a light emitting region and an optical absorption region continued with the light emitting region;

forming a mask pattern over the substrate located on both sides of the optical absorption region; and forming the active layer over the formed structure.

BRIEF DESCRIPTION OF THE DRAWINGS

While the specification concludes with claims particularly pointing out and distinctly claiming the subject matter that is regarded as the invention, it is believed that the invention, along with the objects, features, and advantages thereof, will be better understood from the following description taken in connection with the accompanying drawings, in which:

DETAILED DESCRIPTION OF THE PREFERRED EMBODIMENTS

A. An embodiment of an edge emitting LED

An embodiment of an edge emitting LED according to the present invention will hereinafter be described in detail with reference to the accompanying drawings.

Figure 1:
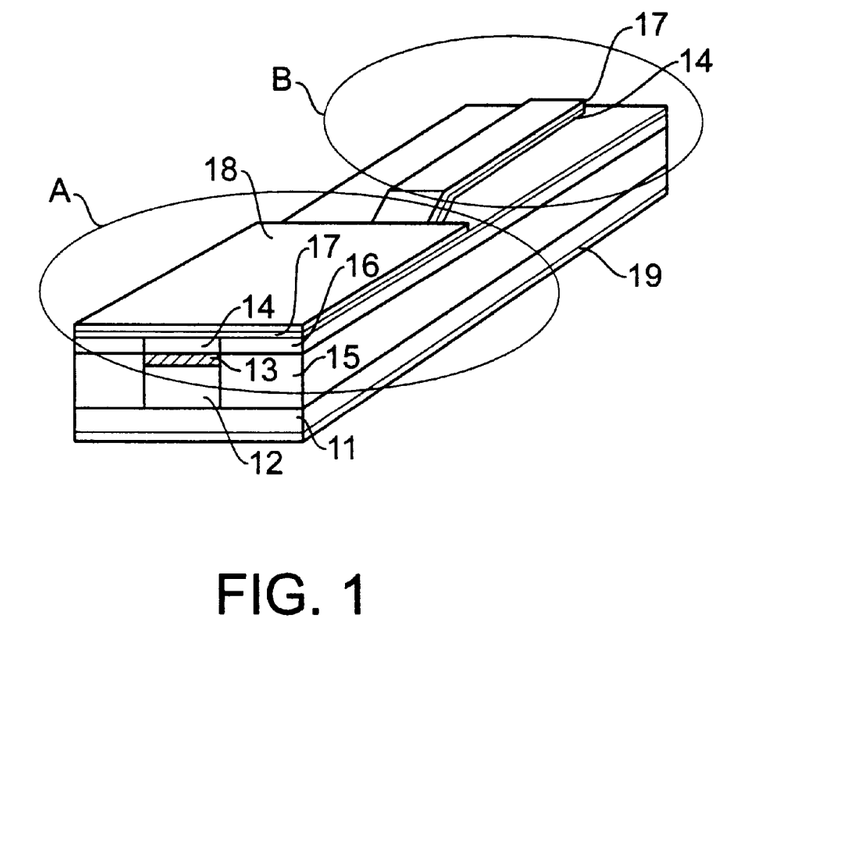
FIG. 1 is a perspective view showing an edge emitting LED according to an embodiment of the present invention.

FIG. 1 is a perspective view showing an edge emitting LED according to an embodiment of the present invention.

Figure 2:
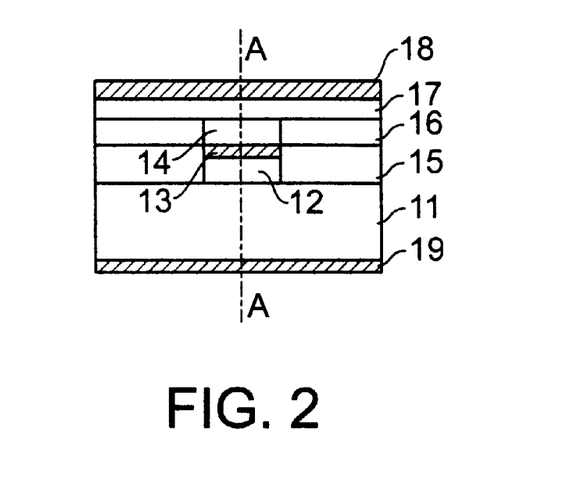
FIG. 2 is a cross sectional view showing an edge emitting LED according to an embodiment of the present invention.

FIG. 2 is a cross sectional view showing an edge emitting LED according to an embodiment of the present invention.

Figure 3:
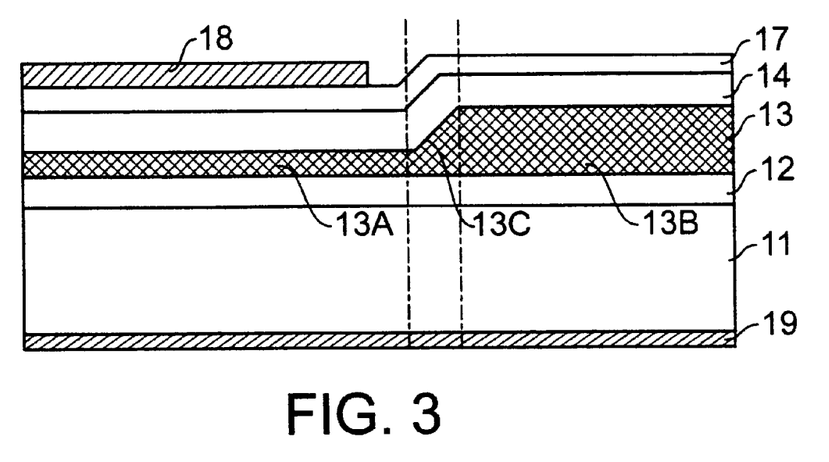
FIG. 3 is a cross sectional view taken, on line A—A of FIG. 2.

FIG. 3 is a cross sectional view taken on line A—A of FIG. 2.

As shown in FIGS. 1 and 2, an edge emitting LED according to the present invention comprises an n-InP substrate 11, an n-InP cladding layer 12 formed on the n-InP substrate 11, an active layer 13 formed on the n-InP cladding layer 12, an n-InP cladding layer 14 formed on the active layer 13, first and second p-InP block layers 15 formed on the n-InP substrate 11 and is an optical confinement layer, a first n-InP block layer 16 formed on the first p-InP block layer 15, a second n-InP block layer 16 formed on the second p-InP block layer 15, a p-InGaAs contact layer 17 formed on the n-InP cladding layer 14 and the n-InP block layers 16, a p-electrode 18 formed on the p-InGaAs contact layer 17, and an n-electrode 19 formed under the n-InP substrate 11.

In this embodiment, the active layer 13 comprises a multiple quantum well layer having a stripe-geometry and is sandwiched between the first p-InP block layer 15 and the second p-InP block layer 15.

As shown in FIG. 3, the multiple quantum well layer 13 has a light emitting region 13A, an optical absorption region 13B and a composition change region 13C between the light emitting region A and the optical absorption region 13B.

The thickness of the optical absorption region 13B is thicker than that of the light emitting region 13A. The thickness and composition of the multiple quantum well layer 13 located in the composition change region 13C continuously changes from the light emitting region 13A to the optical absorption region 13B. Therefore, the optical absorption region 13B have a bandgap energy smaller than that of the light emitting region 13A, and the bandgap energy of the composition change region 13C continuously changes.

The light emitting region 13A and the optical absorption region 13B adopted the multiple quantum well layer 13 comprising seven pieces of a well layer having the bandgap energy of 1.38 $\mu$m and the thickness of 7 nm, and a barrier layer having the bandgap energy of 1.10 $\mu$m and the thickness of 10 nm.

The p-electrode 18 selectively is only located over the light emitting region 13A to confine a driving current to the emission regions.

A length of the p-electrode 18 in an extension direction of the multiple quantum well layer 13 is shorter than that of the light emitting region 13A. Therefore, the present invention is able to prevent which a current is injected into the optical absorption region 13C in order to expand the current.

Since the multiple quantum well layer 13 is burried in the p-InP block layer 15 and the n-InP block layer 16, very small emission spot size can be achieved.

An operation of the edge emitting LED, as follows:

When a current is injected to the multiple quantum well layer of the edge emitting LED, a light is emitted at the light emitting region 13A.

A backward light propagates to the optical absorption region 13B.

Continuous refractive index change between the light emitting region 13A and the optical absorption region 13B prevents from a reflection and a diffraction.

The backward light decreases by an absorption because of a bandgap energy of the optical absorption region 13B.

Furthermore, since a composition of the optical absorption region 13B smalls a bandgap energy to the emition wavelength, multiple reflections in the back facets of the optical absorption region 13B can be completely prevented.

Accordingly, an edge emitting LED of the present invention is able to produce a stable, spontaneous emission of light under a wide range of operating conditions.

B. An embodiment of a method of forming an edge emitting LED.

The embodiment of a method of forming an edge emitting LED according to the present invention will hereinafter be described in detail with reference to FIG. 4.

FIG. 4 is a plane view and a cross sectional view showing an edge emitting LED according to a embodiment of the present invention for forming the edge emitting LED.

Figure 4A:
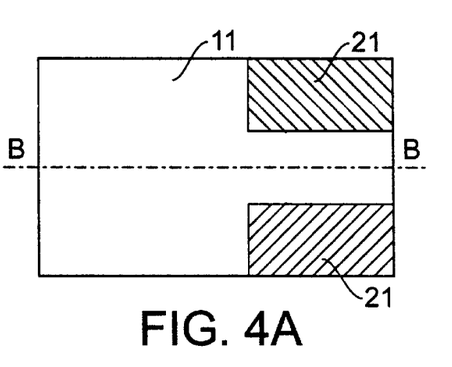
FIG. 4 is a plane view and a cross sectional view showing an edge emitting LED according to a embodiment of the present invention for forming the edge emitting LED.

The process for fabricating the edge emitting LED of the present invention is as follows:

As shown in FIG. 4A, the n-InP substrate 11 has a previous formation region of an active layer 13 having a light emitting region 13A and an optical absorption region 13B continued with the light emitting region 13A. In this embodiment, the active layer 13 comprises a InGaAsP/InGaAsP multiple quantum well structure.

First, a first mask pattern 21 (for example a dielectric film, SiO2) is selectively formed on the n-InP substrate 11 surface on both sides of the optical absorption region 13B.

Figure 4B:
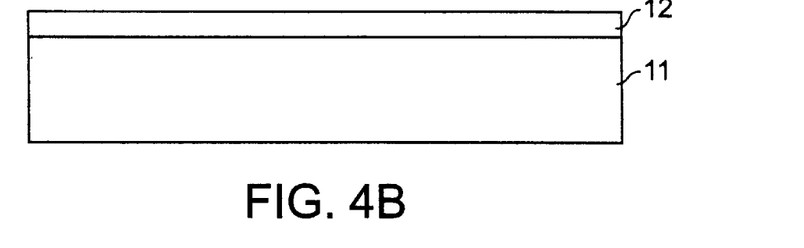

Then, as shown in FIG. 4B, an n-InP cladding layer 12 is formed on the n-InP substrate 11 as is the first mask pattern 21, using a metalorganic vapor phase epitaxial (MOVPE). The precursors for group III and V are trimethylindium and PH3, and the dopant is Si2H6.

Figure 4C:
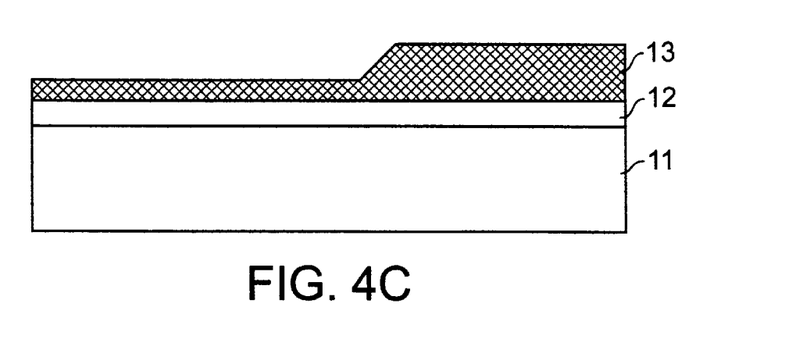

Then, as shown in FIG. 4C, an InGaAsP/InGaAsP multiple quantum well layer 13 is formed on the n-InP clad layer 12, using an MOVPE. The precursors for group III and V are trimethylindium, triethylgallium, AsH3 and PH3, the dopant is DMZn, and a typical growth velocity is 0.8 $\mu$m/hour and a growth temperature is 630° C. at 55 torr.

Figure 4D:
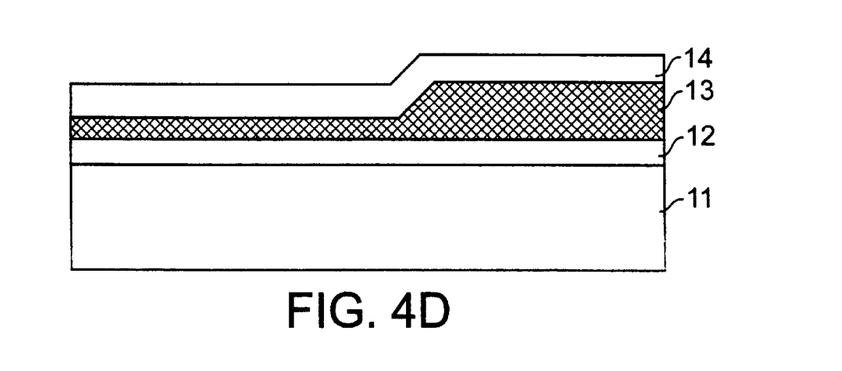

Then, as shown in FIG. 4D, a n-InP cladding layer 14 is formed on the multiple quantum well layer 13, using an MOVPE. The precursors for group III and V are trimethylindium and PH3 and the dopant is DMZn.

The process steps as shown in FIGS. 4A–4D are carried out with one-step MOVPE growth.

Figure 4E:
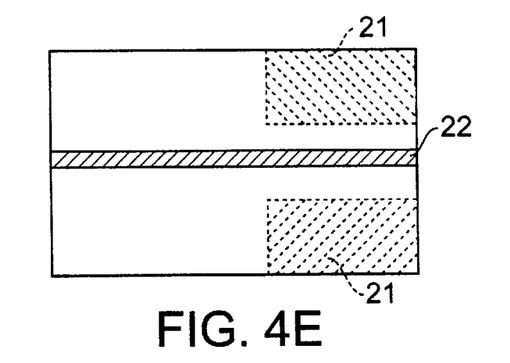

Then, as shown in FIG. 4E, the first mask pattern 21 is removed from the structure formed by the steps. Then, a second mask pattern 22 (for example a dielectric film, SiO2) is then selectively formed on the n-InP cladding layer 14 over the formation region. The shape of the second mask pattern 22 is a straight line. Then, the n-InP cladding layer 12, the multiple quantum well layer 13 and the n-InP cladding layer 14, is etched using the second mask pattern 22.

Figure 4F:
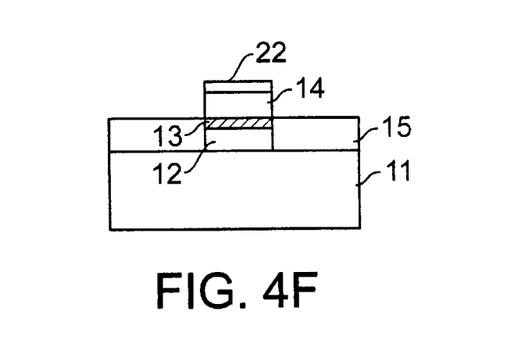

Then, as shown in FIG. 4F, a p-InP block layer 15 is formed on the n-InP substrate 11 in the removed portion, using an MOVPE. The precursors for group III and V are trimethylindium and PH3 and the dopant is DMZn.

Figure 4G:
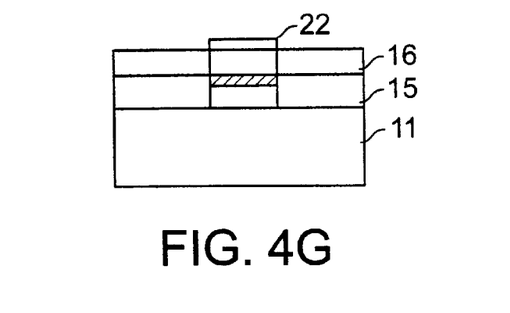

Then, as shown in FIG. 4G, an n-InP block layer 16 is formed on the p-InP block layer 15, using a MOVPE. The precursors for group III and V are trimethylindium and PH3, and the dopant is Si2H6.

Figure 4H:
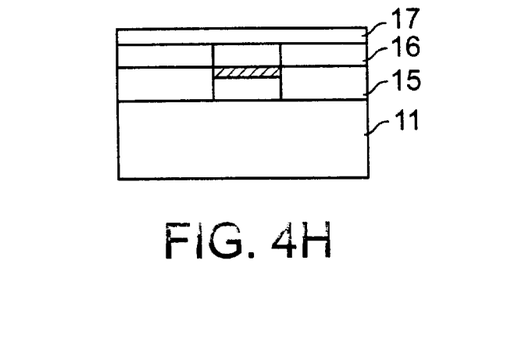

Then, as shown in FIG. 4H, the second mask pattern is removed from the structure formed by the steps. Then, a p-InGaAs contact layer 17 is formed on the n-InP clad layer 14 and the n-InP block layer 16, using an MOVPE. The precursors for group III and V are trimethvlindium, triethylgallium and AsH3, and the dopant is DMZn.

Figure 4I:
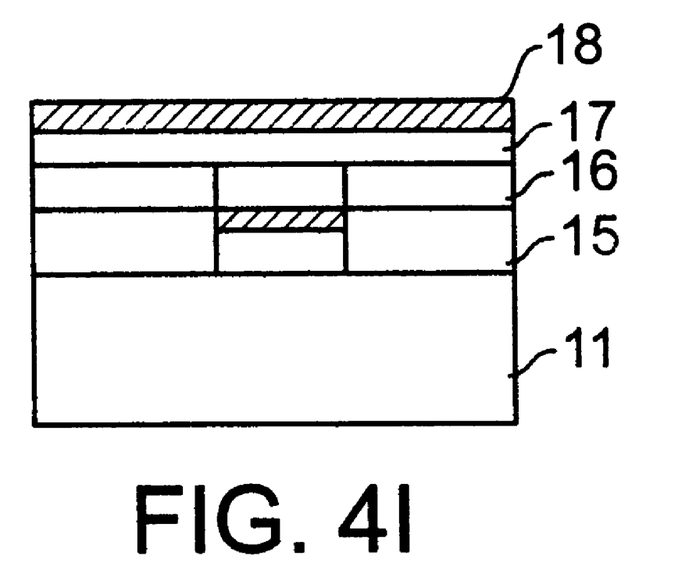
Figure 4J:
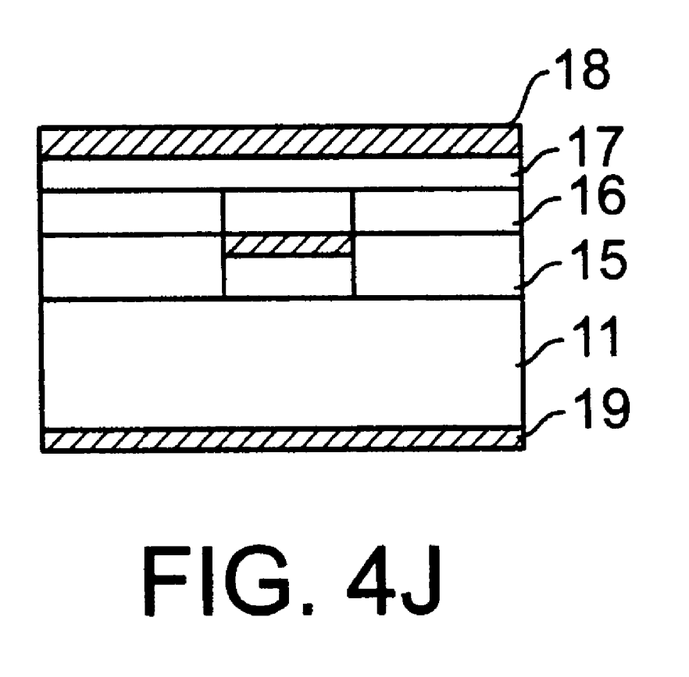

Then, as shown in FIG. 4I, the p-electrode 18 is selectively only formed on the p-InGaAs contact layer 17 over the light emitting region 13A to confine a driving current to the emission region. Then, as shown in FIG. 4J, the n-electrode 19 is formed under the n-InP substrate 11.

Figure 5:
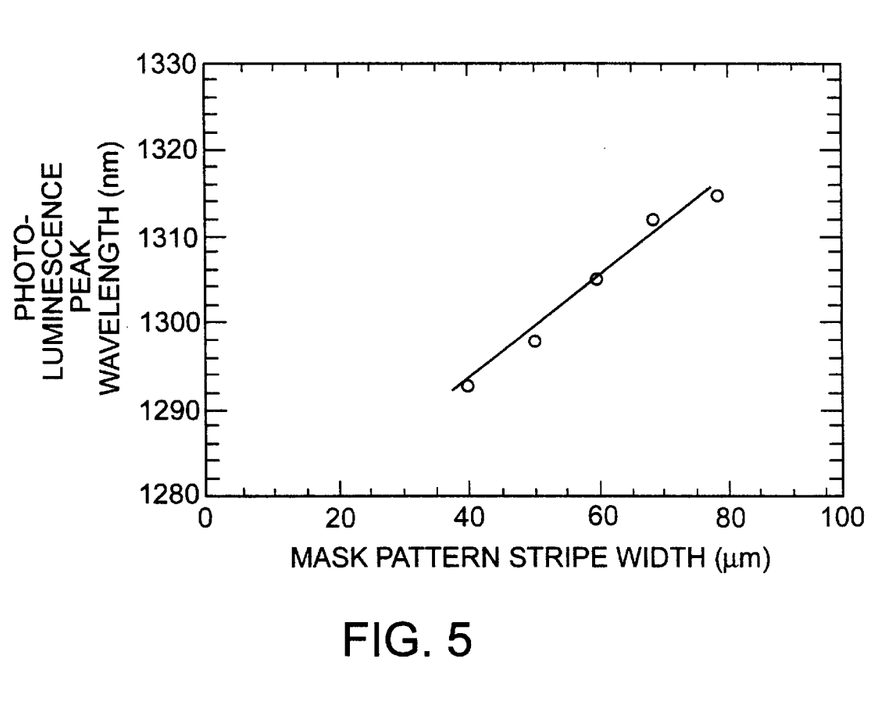
FIG. 5 is a diagram showing a photoluminescence peak wavelength versus a mask stripe width.

FIG. 5 shows dependence of a bandgap energy on a mask pattern stripe.

A method of forming a device for a measurement, as follows:

First, the n-InP substrate 11 has a first region and a second region continued with the first region. A mask pattern (for example a dielectric film, SiO2) is selectively formed on the n-InP substrate surface on both sides of the second region.

Then, an InGaAsP/InGaAsP multiple quantum well layer is formed on the n-InP substrate, using an MOVPE. The precursors for group III and V are trimethylindium, triethylgallium, AsH3 and PH3, the dopant is DMZn, and a typical growth velocity is 0.8 $\mu$m/hour and a growth temperature is 630° C. at 55 torr.

Measured data of the device is as follows:

(1) A photoluminesence peak wavelength of a multiple quantum well layer formed in the first region is 1280 nm.

A photoluminesence peak wavelength of a multiple quantum well layer formed in the second region is 1314 nm.

(2) A bandgap energy of a multiple quantum well layer formed in the second region is smaller than that of a multiple quantum well layer formed in the first region.

(3) A thickness of a multiple quantum well layer formed in the second region is thicker than that of a multiple quantum well layer formed in the first region.

That is, a multiple quantum well layer having a different photoluminesence peak wavelength/ a different bandgap energy/ a different thickness is selectively able to provide, with one-step growth, because of a mask pattern previously formed on the semiconductor substrate and after a multiple quantum well layer forms on the formed structure.

Accordingly, a bandgap energy of a multiple quantum well layer formed in the optical absorption region can be controlled to be smaller than that of a multiple quantum well layer formed in the light emitting region because the first region is applied to a light emitting region and the second region is applied to an optical absorption region.

Accordingly, the method of forming an edge emitting LED is capable of forming a light emitting region and an optical absorption region having deffering compositions and thickness, with one-step growth.

In this manner, the present invention applied selective growth to the optical absorption region of the multiple quantum well layer. The present invention applies control effective reflection at the back facet of the light emitting device. Specially, the present invention may be apply in order to reduce a reflection. The present invention applied to the edge emitting LED of a buried hetero stripe structure. The present invention may be apply a RWG structure, a DC-PBH structure, a BC structure, and a MTBH structure.

While the present invention has been described with reference to the illustrative embodiments, this description is not intended to be construed in a limiting sense. Various modifications of the illustrative embodiments, as well as other embodiments of the invention, will be apparent to those skilled in the art on reference to this description. It is therefore contemplated that the appended claims will cover any such modifications or embodiments as fall within the true scope of the invention.

What is claimed is:

1. A method of forming an edge-emitting LED, comprising:
    forming a mask pattern over a main surface of a substrate to define a selected area for growing an optical absorption region;
    forming an active layer over the main surface of the substrate,
        wherein the active layer is a continuous structure having a light emitting region, an optical absorption region, and a composition change region disposed between the light emitting region and the optical absorption region, and
        wherein the optical absorption region is formed by selective area growth;
    forming a first electrode in only the light emitting region; and
    forming a second electrode on a back surface of the substrate.

2. A method as claimed in claim 1, wherein the active layer comprises a multiple quantum well structure.

3. A method as claimed in claim 1, wherein forming the active layer includes performing organometallic vapor-phase epitaxy.

4. A method according to claim 1, wherein the first electrode is formed so as not to completely cover the light emitting region.

5. A method according to claim 1, wherein a bandgap energy of the optical absorption region is smaller than a bandgap energy of the light emitting region.

6. A method of forming an edge-emitting LED, comprising:
    forming a mask pattern over a main surface of a substrate to define a selected area for growing an optical absorption region;
    forming a first cladding layer over the main surface of the substrate;
    forming an active layer on the first cladding layer;
        wherein the active layer is a continuous structure having a light emitting region, an optical absorption region, and a composition change region disposed between the light emitting region and the optical absorption region, and
        wherein the optical absorption region is formed by selective area growth;
    forming a second cladding layer over the active layer;
    forming a first electrode in only the light emitting region; and
    forming a second electrode on a back surface of the substrate.

7. A method as claimed in claim 6, wherein the active layer comprises a multiple quantum well structure.

8. A method as claimed in claim 7, wherein forming the active layer includes performing organometallic vapor-phase epitaxy.

9. A method as claimed in claim 7, wherein the multiple quantum well structure comprises InGaAsP/InGaAsP.

10. A method as claimed in claim 6, wherein the substrate comprises a first conductivity-type InP layer, the first cladding layer comprises a first conductivity-type InP layer, and the second cladding layer comprises a second conductivity-type InP layer.

11. A method according to claim 6, wherein the first electrode is formed so as not to completely cover the light emitting region.

12. A method according to claim 6, wherein a bandgap energy of the optical absorption region is smaller than a bandgap energy of the light emitting region.

13. A method of forming an edge-emitting LED, comprising:
    forming a mask pattern over a main surface of a substrate to form an optical absorption region;
    forming an active layer over the main surface of the substrate,
        wherein the active layer is a continuous structure having a light emitting region, an optical absorption region, and a composition change region disposed between the light emitting region and the optical absorption region,
        wherein the optical absorption region is formed by selective area growth, and wherein a thickness of the optical absorption region is thicker than a thickness of the light emitting region;

forming a first electrode in only the light emitting region; and forming a second electrode on a back surface of the substrate.

* * * * *